Figure 1:
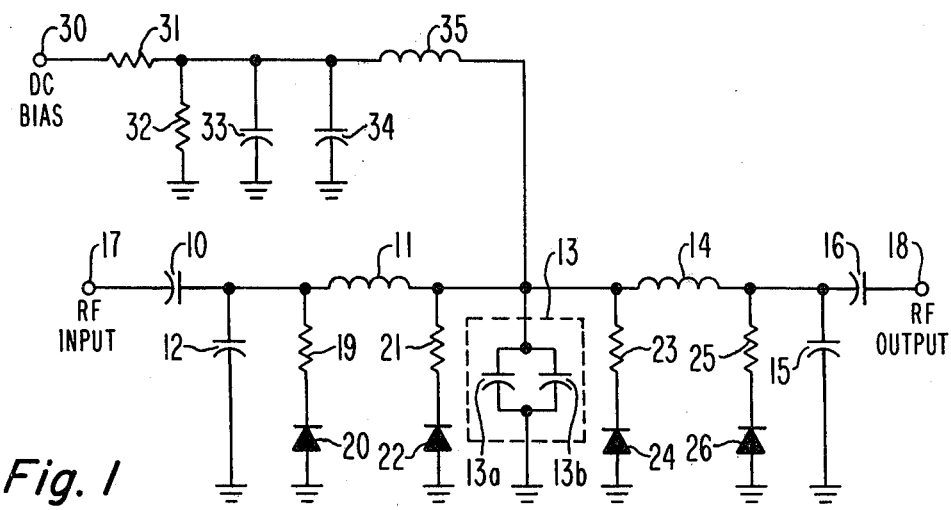

United States Patent [19]

Schwarzmann

[11] 4,378,536

[45] Mar. 29, 1983

[54] HIGH POWER, LOW FREQUENCY, ELECTRONICALLY ADJUSTABLE ATTENUATOR

[75] Inventor: Alfred Schwarzmann, Mount Laurel, N.J.

[73] Assignee: RCA Corporation, New York, N.Y.

[21] Appl. No.: 272,220

[22] Filed: Jun. 9, 1981

[51] Int. Cl.³ .............................................. H03H 7/24
[52] U.S. Cl. ................................. 333/81 R; 307/264
[58] Field of Search .......................... 333/81 R, 81 A; 455/249, 253, 289; 307/264, 543, 556, 561; 330/284

[56] References Cited

U.S. PATENT DOCUMENTS

| | | | |
|---|---|---|---|
| 3,119,080 | 1/1964 | Watters | 455/249 X |
| 3,577,103 | 5/1971 | Sparks | 333/17 |
| 3,775,708 | 11/1973 | Sly | 333/81 A |
| 3,859,609 | 1/1975 | Couvillon et al. | 333/81 A |
| 4,010,430 | 3/1977 | Wolfe | 333/81 A |
| 4,097,827 | 6/1978 | Williams | 333/81 R |
| 4,236,126 | 11/1980 | Weller et al. | 333/81 R |

*Primary Examiner*—Paul L. Gensler
*Attorney, Agent, or Firm*—Joseph S. Tripoli; Robert L. Troike; C. L. Maginniss

[57] ABSTRACT

An attenuator for high-power, low frequency RF signals including two $\pi$-section low-pass filters is well matched to the transmission line characteristic impedance. Each of the four loss branches of the attenuator includes a power resistor and a PIN diode. The attenuator is made electronically variable by controlling the dc bias across the PIN diodes, which respond to increased voltage by exhibiting lowered resistance. At any setting of the dc bias, only a fraction of the attenuated RF power is dissipated by the diodes. When the bias voltage is tuned for high attenuation, virtually all of the power is dissipated by the power resistors.

3 Claims, 2 Drawing Figures

HIGH POWER, LOW FREQUENCY, ELECTRONICALLY ADJUSTABLE ATTENUATOR

The present invention relates to radio frequency attenuators and more particuarly to an electronically adjustable attenuator of high power, low frequency RF signals.

RF signal attenuators are used to control the amplitude of an RF signal transmitted between a source and a load. The attenuator includes loss elements to reduce the input signal by a fixed proportion. In order to minimize reflections of the input signal, the impedance of the attenuator is matched to the RF line into which it is inserted. An attenuator can be made to provide a range of insertion losses through the use of variable resistance loss elements. The resistance of the loss elements can be made variable through mechanical means, such as a rheostat, or it can be made electronically variable, by the use of controlled bias currents through current-sensitive variable resistance means.

PIN diodes are especially useful in variable RF attenuators. Their high carrier lifetimes cause them to act as pure resistances to RF signals while acting as diodes to DC signals. PIN diodes exhibit an RF impedance which is variable in response to the applied bias current. As the DC current through the diode increases, its resistance to RF signals decreases. Hence, PIN diodes shunting the RF signal line to ground will absorb an amount of the RF signal proportional to the DC bias through the diode.

In communication systems electronically adjustable attenuators are becoming important for fast, automatic RF power control. At the present time, only high frequency, low power electronically adjustable attenuators are available. There is a need for an electronically adjustable attenuator capable of handling power signals in the relatively low RF band of FM communications. The present invention discloses an electronically adjustable RF attenuator which can dissipate power in excess of 15 watts in the 88-108 MHz (FM broadcast) range.

In accordance with the present invention, an apparatus is disclosed for attenuating a high power radio frequency (RF) signal. The apparatus includes two cascaded low-pass filters having an input terminal to which the RF signal is applied and having an output terminal. Each low-pass filter has at least one low frequency pass element as its series branch and at least one high frequency pass element as its shunt branch. Loss branches are coupled across each of the shunt branches; each loss branch includes a fixed resistance in series with a current-dependent resistance means which responds to increased DC current therethrough by exhibiting a lowered resistance. Means are provided for applying substantially equal DC bias currents through the loss elements to provide loss paths for the RF signal in which the power loss is proportional to the DC bias current.

Figure 2:
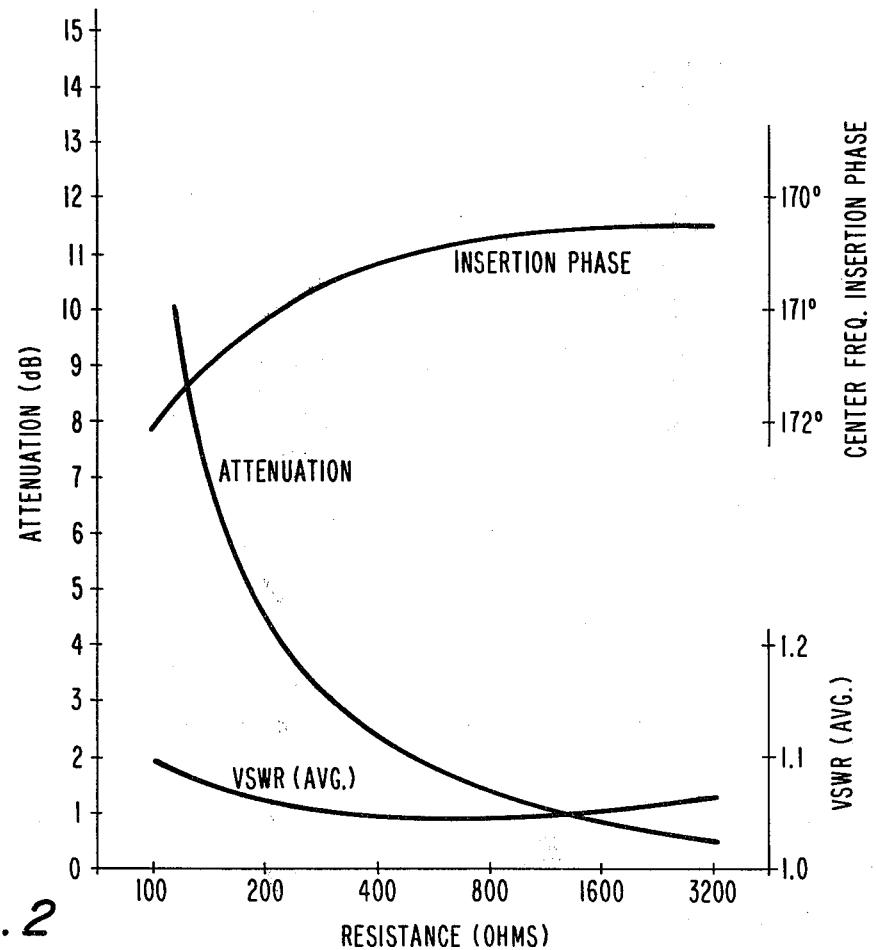

In the drawing:

FIG. 1 is a circuit diagram representation of the preferred embodiment of the attenuator of the present invention; and FIG. 2 is a graphical representation of performance characteristics of the preferred embodiment.

FIG. 1 depicts an electronically variable attenuator for high power, low frequency RF signals. Using the component values which will be specified later, an effective range of attenuation of one to six db has been achieved. The attenuator is designed to match a transmission line having a characteristic impedance of 50 ohms, and provide a minimum of reflection over the adjustment range of the attenuator. It has an insertion loss of less than 1 db and it maintains a substantially flat phase shift response of less than 2 degrees over the range of attenuation.

The preferred embodiment as shown in FIG. 1 includes two cascaded $\pi$-section low-pass filters, four loss branches, and means for providing dc current through those loss branches. The first $\pi$-section filter comprises inductor 11 and capacitors 12 and 13a; the second filter comprises inductor 14 and capacitors 13b and 15. (In actual circuit construction, capacitors 13a and 13b would be combined in a single circuit element, and, when appropriate, that circuit element will be referred to as capacitor 13.)

Loss elements comprising a resistor in series with a PIN diode are connected across each of the shunt elements of the two filters. Resistor 19 and PIN diode 20 are connected across capacitor 12, resistor 21 and PIN diode 22 are connected across capacitor 13a, resistor 23 and PIN diode 24 are connected across capacitor 13b, and resistor 25 and PIN diode 26 are connected across capacitor 15.

An RF input signal is coupled from input terminal 17 to the first filter via capacitor 10, which serves to pass the ac component of the signal while blocking the dc component. Additionally, capacitor 16 couples the ac portion of the signal from the second filter to the output terminal 18, while blocking the dc component.

A dc bias signal, used to control the attenuation of the circuit, is provided at dc bias terminal 30. Resistors 31 and 32 provide a voltage division to reduce the bias voltage to a range of values appropriate to the needs of the attenuator. Capacitors 33 and 34 serve to bypass the ac component of the bias voltage to ground to ensure that no modulated signal (noise) is introduced into the attenuator with the bias signal. Inductor 35 acts as a high impedance to the RF signal, to ensure that it does not flow into the biasing network.

Because of their high carrier lifetimes, PIN diodes are often used as non-linear resistance devices. With no forward dc current flowing through them, they appear as high-resistance devices, but in the presence of a forward current, the resistance drops to as low as 1 ohm. The PIN diodes of the applicant's circuit are Model No. UM4300, sold by Unitrode Corp., Lexington, Mass., but any equivalent PIN diode having a carrier lifetime sufficient to conduct RF signals in the FM broadcast band may be used.

With a bias voltage of zero, no dc current flows through the diodes and the loss branches appear as high-resistance paths to the RF signal. The attenuation provided under this condition is minimal. As forward current begins to flow through the loss branches, in response to an increasing negative voltage applied to dc bias terminal 30, the resistance of PIN diodes 20, 22, 24, and 26 decreases, diminishing the resistance of each of the four loss branches, and providing an increased attenuation by the circuit. For a sufficiently large negative voltage, the resistance of the PIN diodes, 20, 22, 24, and 26 is substantially zero, the resistance of the loss branches is entirely dependent on resistors 19, 21, 23, and 25, and the maximum attenuation is achieved. Thus, it can be seen that the PIN diodes 20, 22, 24, and 26 absorb only a fraction of the total power dissipated by the attenuator, and under high attenuation conditions, virtually all of the power is dropped across resistors 19, 21, 23, and 25, which are of the high-power type. Because the dc resistance of inductors 11 and 14 is virtually zero, the forward dc bias currents through the four loss branches are substantially identical, providing an equal distribution of power dissipation throughout the loss branches.

Variable attenuators of RF signals require a vehicle for the inclusion of the loss elements, i.e, an RF network of the type to which the power attenuating components may be applied without having a significant effect on the insertion impedance. The use of such a network ensures that the attenuator impedance remains substantially constant over the range of attenuation, thereby providing a minimum of wave reflection.

The low-pass filter of the present invention is the ideal RF network on which the attenuator can be built. It avoids the use of series loss elements, which present problems of effective heat dissipation. It is far more difficult to dissipate heat from series elements than from shunt elements which are thermally connected to ground. Further, the ability to provide all loss elements in the shunt paths permits a relatively simple biasing scheme, wherein all biasing current flows from a single point through each individual shunt loss element, thereby avoiding the complex biasing networks of attenuators having series loss elements.

The attenuator of the embodiment described above was constructed and tested using component values as follows:

Capacitors 10, 16, and 33: 1000 pf;
Capacitors 12 and 15: 30 pf;
Capacitor 13: 65 pf;
Capacitor 34: 10,000 pf;
Inductors 11 and 14: 0.08 uH, (Seven turns of #18 AWG wire on a one-eighth inch form);
Inductor 35: 0.68 uH;
Resistors 19, 21, 23, and 25: 100 ohms, 10 watts;
Resistor 31: 1,000 ohms; and
Resistor 32: 10 kilohms.

The values of resistors 31 and 32 were chosen merely to accommodate the particular source of bias used, providing a voltage division of one-eleventh. The value of capacitor 13, which represents one shunt leg in each of the two $\pi$-section filters, is somewhat greater than twice the value of capacitors 12 and 15. This selection was made in the interest of standard parts availability and, in a circuit requiring critical impedance matching, more precise parts selection would be warranted.

Using standard formulas for low-pass constant-k filters, the characteristic impedance of the $\pi$-section filters of the preferred embodiment, at a center-band frequency of 100 MHz, is 50 ohms, indicating a favorable match when inserted into a 50 ohm transmission line. The low characteristic impedance of the filters also indicates that the loss branches will have very little impact on the characteristic impedance of the attenuator, as, for relatively low levels of attenuation, the resistance of the PIN diodes is substantially greater than 50 ohms. Using a standard formula for cutoff frequency yields a frequency of 145 KHz, below which all signals will be passed without filter attenuation. This design insures that the filters will attenuate signal harmonics without affecting the FM signals in the band of interest.

FIG. 2 is a graph showing the system performance of the above-described embodiment. The ATTENUATION curve demonstrates that the insertion loss of the attenuator is less than one db, and that a wide range of attenuation is selectable before the resistance of the PIN diodes 20, 22, 24, and 26 is effectively zero, and the entire loss is borne by resistors 19, 21, 23, and 25. The VSWR (AVG.) curve demonstrates that the standing wave ratio is less than 1.1 over the entire range of attenuation, indicating favorable matching for the transmission line characteristic impedance of 50 ohms. The INSERTION PHASE curve demonstrates that the phase change of the attenuator, at the center-range frequency of 100 MHz, is less than two degrees over the range of attenuation.

The useful attenuation range of the attenuator constructed using 100 ohms as the value of resistors 19, 21, 23, and 25 is one to six db. A greater power handling capacity can be obtained by increasing the values of resistors 19, 21, 23, and 25 to 150 ohms, at the sacrifice of a decreased attenuation range of one to four db. If an increased attenuation range is required, a useful range of one to ten db can be provided at a sacrifice of power handling capacity, by the selection of 65 ohms for resistors 19 and 25 and 30 ohms for resistors 21 and 23.

Although the embodiment of the attenuator of the present invention has been described as one which employs two $\pi$-section low-pass filters, it should be obvious to one skilled in the art that other constant-k low-pass filters could be used, as well as the L-section prototypes of $\pi$-section and T-section filters. The $\pi$-section filter of the present embodiment provides the advantage of low cost and space requirement, because of its fewer components and smaller size.

The attenuator of the present invention could also be embodied with a single $\pi$-section or T-section filter. However, the use of two low-pass filters provides the advantages of a flatter response in the pass band and sharper attenuation above the cutoff frequency. Further, an embodiment including two low-pass filter sections allows for the use of four loss branches providing the ability to dissipate a greater amount of power while maintaining optimal matching of the attenuator to the transmission line.

What is claimed is:
1. An apparatus for attenuating a high-power radio frequency (RF) signal comprising:
   two low-pass filters in cascade combination, each of said filters having at least one low frequency pass element as its series branch and at least one high frequency pass element as its shunt branch, said combination having an input terminal for applying said RF signal and an output terminal;
   at least two loss elements connected respectively in parallel with each of said shunt branches, each of said loss elements comprising fixed resistance means of the high-power dissipation type in series with current-dependent resistance means responding to increased current flow therethrough to exhibit lowered resistance; and
   means for applying substantially equal dc bias currents through said loss elements to thereby provide loss paths for said RF signal in which the power losses are proportional to said dc bias currents.
2. The apparatus according to claim 1 wherein said low-pass filters comprise $\pi$-section filters, each having a single low frequency pass element as its series branch and two high frequency pass elements as its shunt branches.
3. The apparatus according to claim 1 wherein said current-dependent resistance means are PIN diodes.

* * * * *